United States Patent
Suzuki et al.

(10) Patent No.: US 8,519,755 B2
(45) Date of Patent: Aug. 27, 2013

(54) POWER-ON RESET CIRCUIT

(75) Inventors: Hajime Suzuki, Tokyo (JP); Satoshi Miura, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 0 days.

(21) Appl. No.: 13/255,704

(22) PCT Filed: Feb. 25, 2010

(86) PCT No.: PCT/JP2010/052940
§ 371 (c)(1), (2), (4) Date: Oct. 12, 2011

(87) PCT Pub. No.: WO2010/103931
PCT Pub. Date: Sep. 16, 2010

(65) Prior Publication Data
US 2012/0032717 A1    Feb. 9, 2012

(30) Foreign Application Priority Data
Mar. 11, 2009   (JP) ................ P2009-057651

(51) Int. Cl.
*H03K 7/00*    (2006.01)
(52) U.S. Cl.
USPC ............ 327/143; 327/142; 327/198; 327/539
(58) Field of Classification Search
USPC ............... 327/142, 143, 198, 530, 538–543, 327/546; 323/312–317
See application file for complete search history.

(56) References Cited

U.S. PATENT DOCUMENTS

| | | |
|---|---|---|
| 5,867,047 A | 2/1999 | Kraus |
| 6,509,768 B2 | 1/2003 | Polizzi et al. |
| 6,803,751 B2 | 10/2004 | Messager |
| 6,847,240 B1 * | 1/2005 | Zhou .............................. 327/143 |
| 7,332,946 B2 * | 2/2008 | Pan et al. ....................... 327/143 |

(Continued)

FOREIGN PATENT DOCUMENTS

CN        1713526 A        12/2005

OTHER PUBLICATIONS

International Preliminary Report on Patentability issued Oct. 27, 2011 in corresponding PCT Application No. PCT/2010/052940.

(Continued)

*Primary Examiner* — Lincoln Donovan
*Assistant Examiner* — Brandon S Cole
(74) *Attorney, Agent, or Firm* — Sughrue Mion, PLLC

(57) ABSTRACT

When the value of a power supply voltage (VDD) becomes a first threshold value or higher, a first start-up circuit (20) causes a band gap reference circuit (10) to start a stable operation and a first voltage value ($V_A$) is output from the band gap reference circuit (10). When the value of the power supply voltage becomes a second threshold value or higher which is greater than the first threshold, a second start-up circuit (40) turns on a PMOS transistor ($MP_3$) of a voltage dividing circuit (30), and a second voltage value ($V_B$) output from the voltage dividing circuit (30) becomes a value, which is derived by dividing the value of the power supply voltage according to the resistance ratio of resistors ($R_{31}$, $R_{32}$). From a voltage comparison circuit (50), a reset level voltage value is output when the second voltage value ($V_B$) is smaller than the first voltage value ($V_A$), and a power-supply voltage level voltage value is output if the second voltage value ($V_B$) becomes the first voltage value ($V_A$) or higher.

3 Claims, 3 Drawing Sheets

(56) References Cited

U.S. PATENT DOCUMENTS

| | | | |
|---|---|---|---|
| 7,466,172 B2 | 12/2008 | Liu | |
| 2005/0134334 A1* | 6/2005 | Mikyska | 327/143 |
| 2006/0007616 A1* | 1/2006 | Pan et al. | 361/90 |
| 2006/0208777 A1* | 9/2006 | Ichikawa et al. | 327/142 |
| 2007/0057716 A1* | 3/2007 | Pan et al. | 327/539 |

OTHER PUBLICATIONS

Japanese Office Action for corresponding JP2009-057651 dated Aug. 30, 2011.

Office Action issued by Chinese Patent Office in Chinese Application No. 201080010936.2 dated Jun. 6, 2013.

* cited by examiner

POWER-ON RESET CIRCUIT

TECHNICAL FIELD

The invention relates to power-on reset circuits.

BACKGROUND ART

A power-on reset circuit is used in order to secure the stable operation after starting to supply a power supply voltage in various electronic devices. That is, the value of a power supply voltage supplied to an electronic device gradually increases from a ground potential level at the start of supply and will soon reach a constant level. If such a gradually-increasing power supply voltage value is directly provided to each circuit in an electronic device, the electronic device may not normally operate. Then, the power-on reset circuit, in the course of increasing of the power supply voltage value, provides a reset level voltage value to each circuit in the electronic device when the power supply voltage value is less than a threshold value, and will provide a power-supply voltage level voltage value to each circuit in the electronic device when the power supply voltage value becomes the threshold value or higher, thereby securing the stable operation of the electronic device.

Such a power-on reset circuit generally includes a bandgap reference circuit, a voltage dividing circuit, and a voltage comparison circuit as disclosed in Patent Documents 1 and 2. Even if there is a variation in the value of a power supply voltage to be supplied or a temperature variation, the bandgap reference circuit can output a voltage value with a small variation (hereinafter, referred to as a "first voltage value").

On the other hand, the voltage dividing circuit includes a first resistor and a second resistor connected in series between a power supply voltage terminal to which the power supply voltage is supplied and a ground terminal, and outputs a voltage value, which is derived by dividing a power supply voltage value according to a ratio of the respective resistance values of the first resistor and second resistor, from a connection point between the first resistor and the second resistor. That is, the voltage dividing circuit outputs a voltage value (hereinafter, referred to as a "second voltage value") proportional to the power supply voltage value.

Then, the voltage comparison circuit receives the first voltage value output from the bandgap reference circuit and the second voltage value output from the voltage dividing circuit, and outputs the reset level voltage value when the second voltage value is smaller than the first voltage value, and outputs the power-supply voltage level voltage value if the second voltage value becomes the first voltage value or higher.

CITATION LIST

Patent Literature

Patent Document 1: U.S. Pat. No. 5,867,047
Patent Document 2: U.S. Pat. No. 6,847,240

SUMMARY OF INVENTION

Technical Problem

In the power-on reset circuit, in the course of increasing of the power supply voltage value after starting to supply the power supply voltage, at the beginning the second voltage value is greater than the first voltage value, and thereafter, for a certain period of time, the second voltage value becomes smaller than the first voltage value, and further thereafter the second voltage value becomes the first voltage value or higher. The power-on reset circuit, during a period when the second voltage value is smaller than the first voltage value (hereinafter, referred to as a "reset period"), outputs a reset level voltage value to reset each circuit in an electronic device, thereby securing a stable operation of the electronic device thereafter.

However, in the conventional power-on reset circuits including those disclosed in Patent Documents 1, 2, the length of the reset period is unstable. Without a sufficient length of reset period, the stable operation of the electronic device may not be obtained.

The invention has been made in order to resolve the above-described problem and provides a power-on reset circuit capable of stably providing a sufficient length of reset period.

Solution to Problem

A power-on reset circuit according to the invention comprises: (1) a bandgap reference circuit to which a power supply voltage is supplied, and which outputs a predetermined first voltage value; (2) a first start-up circuit causing the bandgap reference circuit to start a stable operation when a value of the power supply voltage becomes a first threshold value or higher; (3) a voltage dividing circuit including: a switch and a first resistor provided in series between a power supply voltage terminal to which the power supply voltage is supplied and an output terminal; and a second resistor provided between the output terminal and a ground terminal, the voltage dividing circuit outputting a second voltage value from the output terminal; (4) a second start-up circuit which causes the switch of the voltage dividing circuit to close when the value of the power supply voltage becomes greater a second threshold value or higher which is greater than the first threshold value; (5) a voltage comparison circuit, which receives a first voltage value output from the bandgap reference circuit and a second voltage value output from the voltage dividing circuit, and outputs a reset level voltage value when the second voltage value is smaller than the first voltage value, and outputs the power-supply voltage level voltage value if the second voltage value becomes the first voltage value or higher.

In the power-on reset circuit according to the invention, when the value of the power supply voltage becomes the first threshold or higher, the first start-up circuit causes the band gap reference circuit to start a stable operation and the predetermined first voltage value is output from the band gap reference circuit. On the other hand, when the value of the power supply voltage becomes the second threshold or higher which is greater than the first threshold, the second start-up circuit causes the switch of the voltage dividing circuit to close, and the second voltage value output from the voltage dividing circuit is thus a value which is derived by dividing the power supply voltage according to a ratio of the respective resistance values of the first resistor and the second resistor. The first voltage value output from the bandgap reference circuit and the second voltage value output from the voltage dividing circuit are input to the voltage comparison circuit. Then, the voltage comparison circuit outputs the reset level voltage value when the second voltage value is smaller than the first voltage value, and outputs the power-supply voltage level voltage value if the second voltage value becomes the first voltage value or higher.

Advantageous Effects of Invention

According to the invention, a sufficient length of reset period can be stably obtained.

DESCRIPTION OF EMBODIMENTS

Figure 1:
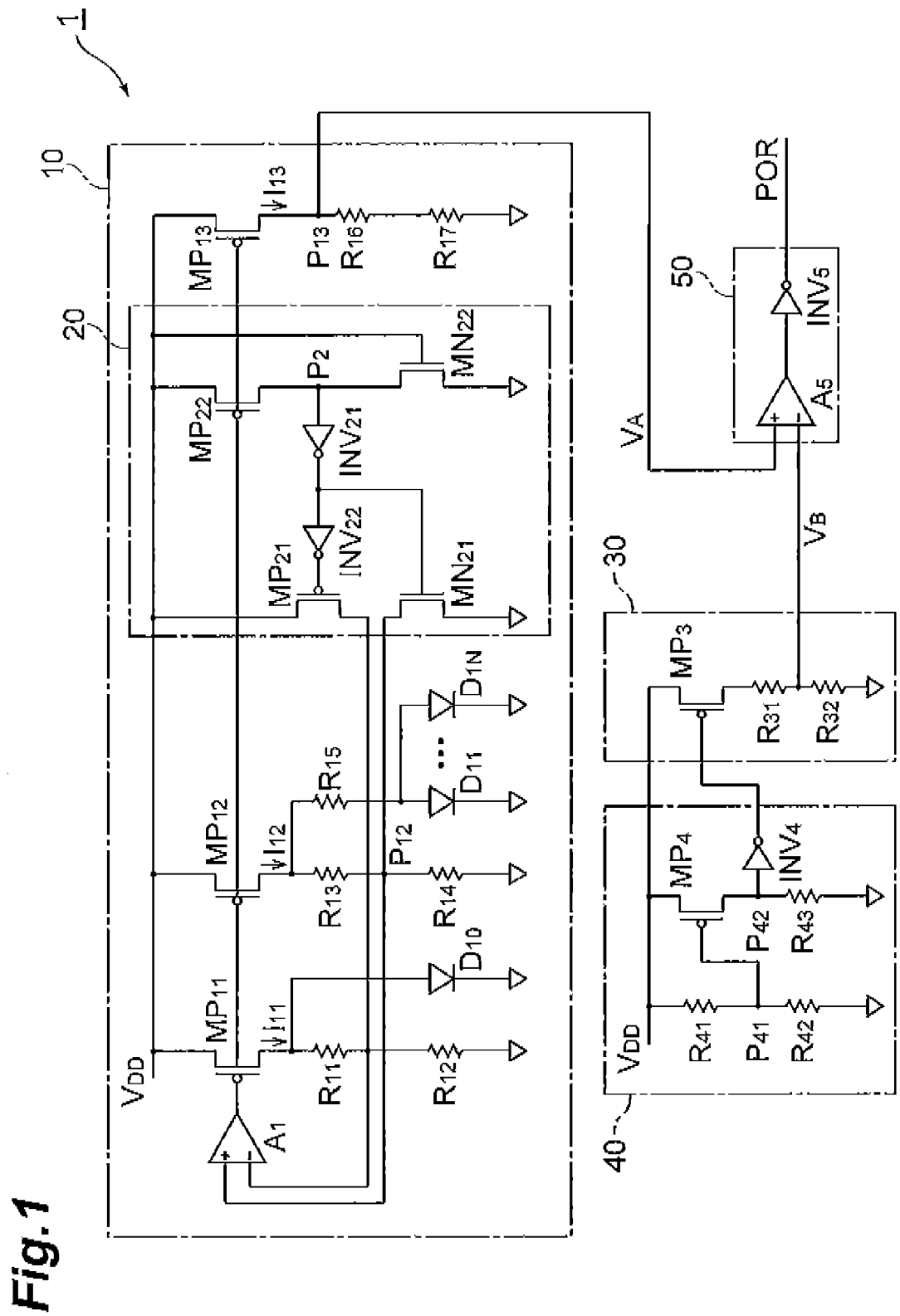
FIG. 1 is a circuit diagram of a power-on reset circuit 1 according to an embodiment.

Hereinafter, with reference to the accompanying drawings, an embodiment of the invention is described in detail. Note that, in the drawings for explaining the embodiment, the same reference numeral is attached to the same element, and the repeated explanation thereof is omitted.

FIG. 1 is a circuit diagram of a power-on reset circuit 1 according to the embodiment. The power-on reset circuit 1 shown in the diagram includes a bandgap reference circuit 10, a first start-up circuit 20, a voltage dividing circuit 30, a second start-up circuit 40, and a voltage comparison circuit 50. A common power supply voltage VDD is provided to these circuits.

The bandgap reference circuit 10 is supplied with a power supply voltage VDD and outputs a predetermined first voltage value $V_A$, and includes PMOS transistors $MP_{11}$-$MP_{13}$, resistors $R_{11}$-$R_{17}$, diodes $D_{10}$-$D_{IN}$, and an amplifier $A_1$.

The respective source terminals of the PMOS transistors $MP_{11}$-$MP_{13}$ are connected to a power supply voltage terminal to which the power supply voltage VDD is supplied. The respective gate terminals of the PMOS transistors $MP_{11}$-$MP_{13}$ are connected to an output terminal of the amplifier $A_1$.

The drain terminal of the PMOS transistor $MP_{11}$ is connected to an inverting input terminal of the amplifier $A_1$ via the resistor $R_{11}$, and connected to a ground terminal via the resistor $R_{11}$ and resistor $R_{12}$ connected in series, and also connected to the ground terminal via the diode $D_{10}$.

The drain terminal of the PMOS transistor $MP_{12}$ is connected to a non-inverting input terminal of the amplifier $A_1$ via the resistor $R_{13}$, and connected to the ground terminal via the resistor $R_{13}$ and resistor $R_{14}$ connected in series, and also connected to one end of the resistor $R_{15}$. The other end of the resistor $R_{15}$ is connected to the ground terminal via N diodes (N is an integer of 2 or more) $D_{11}$-$D_{IN}$ connected in parallel.

The respective resistance values of the resistor $R_{11}$ and resistor $R_{13}$ are equal to each other. The respective resistance values of the resistor $R_{12}$ and resistor $R_{14}$ are equal to each other. The respective forward voltages of the diodes $D_{10}$-$D_{IN}$ vary with the magnitude of a current.

The drain terminal of the PMOS transistor $MP_{13}$ is connected to the ground terminal via the resistor $R_{16}$ and resistor $R_{17}$ connected in series. The bandgap reference circuit 10 outputs a voltage value of the drain terminal of the PMOS transistor $MP_{13}$ as the first voltage value $V_A$.

The first start-up circuit 20 causes the bandgap reference circuit 10 to start a stable operation when the value of the power supply voltage VDD becomes the first threshold value $V_{th1}$ or higher. The first start-up circuit 20 includes the PMOS transistors $MP_{21}$, $MP_{22}$, the NMOS transistors $MN_{21}$, $MN_{22}$, and the inverters $INV_{21}$, $INV_{22}$.

The respective source terminals of the PMOS transistors $MP_{21}$, $MP_{22}$ are connected to the power supply voltage terminal to which the power supply voltage VDD is supplied. The drain terminal of the PMOS transistor $MP_{21}$ is connected to the inverting input terminal of the amplifier $A_1$ in the bandgap reference circuit 10. The drain terminal of the PMOS transistor $MP_{22}$ is connected to the drain terminal of the NMOS transistor $MN_{22}$. The drain terminal of the NMOS transistor $MN_{21}$ is connected to the non-inverting input terminal of the amplifier $A_1$ in the bandgap reference circuit 10. The respective source terminals of the NMOS transistors $MN_{21}$, $MP_{22}$ are connected to the ground terminal.

The drain terminal of the PMOS transistor $MP_{22}$ is connected to the gate terminal of the MMOS transistor $MN_{21}$ via the inverter $INV_{21}$, and also connected to the gate terminal of the PMOS transistor $MP_{21}$ via the inverters $INV_{21}$, $INV_{22}$ connected in series. The gate terminal of the PMOS transistor $MP_{22}$ is connected to the output terminal of the amplifier $A_1$ in the bandgap reference circuit 10. The gate terminal of the NMOS transistor $MN_{22}$ is connected to the power supply voltage terminal.

The on-resistance value of the NMOS transistor $MN_{22}$ is greater than the on-resistance value of the PMOS transistor $MP_{22}$. In the NMOS transistor $MN_{22}$, in order to increase the on-resistance value, a gate length L is long relative to a gate width W, for example, the gate length L is 100 times the gate width W.

The voltage dividing circuit 30 includes: the PMOS transistor $MP_3$ and the first resistor $R_{31}$ provided in series between the power supply voltage terminal to which the power supply voltage VDD is supplied and the output terminal: and the second resistor $R_{32}$ provided between the output terminal and the ground terminal, and outputs a second voltage value $V_B$ from the output terminal.

The source terminal of the PMOS transistor $MP_3$ is connected to the power supply voltage terminal to which the power supply voltage VDD is supplied, and the drain terminal of the PMOS transistor $MP_3$ is connected to one end of the resistor $R_{31}$. The other end of the resistor $R_{31}$ is connected to the ground terminal via the resistor $R_{32}$. The connection point between the resistor $R_{31}$ and the resistor $R_{32}$ serves as the output terminal of the voltage dividing circuit 30.

The PMOS transistor $MP_3$ acts as a switch. That is, when the PMOS transistor $MP_3$ is in an off state, the switch is opened and the second voltage value $V_B$ output from the output terminal becomes the ground level. When the PMOS transistor $MP_3$ is in an on state, the switch is closed and the second voltage value $V_B$ output from the output terminal becomes a voltage value, which is derived by dividing the value of the power supply voltage VDD according to a ratio of the respective resistance values of the resistor $R_{31}$ and resistor $R_{32}$.

The second start-up circuit 40 causes the switch of the voltage dividing circuit 30 to close when the value of the power supply voltage VDD becomes the second threshold value $V_{th2}$ or higher which is greater than the first threshold value $V_{th1}$. The second start-up circuit 40 includes the PMOS transistor $MP_4$, the resistors $R_{41}$-$R_{43}$, and the inverter $INV_4$.

The source terminal of the PMOS transistor $MP_4$ is connected to the power supply voltage terminal to which the power supply voltage VDD is supplied. The gate terminal of the PMOS transistor $MP_4$ is connected to the power supply voltage terminal via the resistor $R_{41}$ and also connected to the ground terminal via the resistor $R_{42}$. The drain terminal of the PMOS transistor $MP_4$ is connected to the ground terminal via the resistor $R_{43}$ and also connected to the gate terminal of the PMOS transistor $MP_3$ of the voltage dividing circuit 30 via the inverter $INV_4$.

The voltage comparison circuit 50 receives the first voltage value $V_A$ output from the bandgap reference circuit 10 and the second voltage value $V_B$ output from the voltage dividing circuit 30, and outputs the reset level voltage value when the second voltage value $V_B$ is smaller than the first voltage value $V_A$, and outputs the power-supply voltage level voltage value if the second voltage value $V_B$ becomes the first voltage value $V_A$ or higher. The voltage comparison circuit 50 includes the amplifier $A_5$ and the inverter $INV_5$.

The first voltage value $V_A$ output from the bandgap reference circuit 10 is input to the non-inverting input terminal of the amplifier $A_5$. The second voltage value $V_B$ output from the voltage dividing circuit 30 is input to the inverting input terminal of the amplifier $A_5$. The voltage comparison circuit 50 outputs a signal passing from the output terminal of the amplifier $A_5$ through the inverter $INV_5$, as a power-on reset signal POR.

Figure 2:
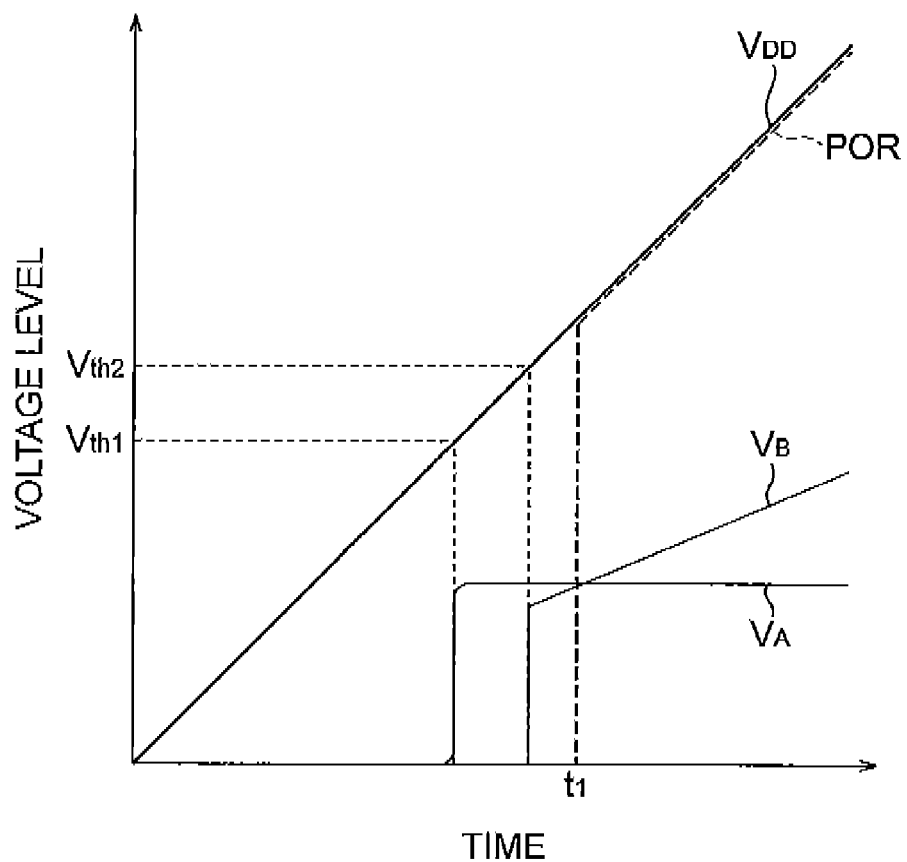
FIG. 2 is a graph showing the temporal variation of each voltage value in the power-on reset circuit 1 according to the embodiment.

Next, the operation of the power-on reset circuit 1 according to the embodiment is described. FIG. 2 is a graph showing the temporal variation of each voltage value in the power-on reset circuit 1 according to the embodiment. This graph shows the temporal variation of each of the power supply voltage VDD supplied to the power-on reset circuit 1, the first voltage value $V_A$ output from the bandgap reference circuit 10, the second voltage value $V_B$ output from the voltage dividing circuit 30, and the power-on reset signal POR output from the voltage comparison circuit 50.

The value of the power supply voltage VDD supplied to the power-on reset circuit 1 is the ground potential level at the start of supplying the power supply voltage, and thereafter will gradually increase.

In the bandgap reference circuit 10, for a certain period immediately after starting to supply the power supply voltage, the operation is not stable and the output voltage value $V_A$ takes uncertain values between the ground potential level and the power supply voltage level.

When the value of the power supply voltage VDD reaches the first threshold value $V_{th1}$, then in the first start-up circuit 20, the NMOS transistor $MN_{22}$ is turned on and a connection point $P_2$ between the PMOS transistor $MP_{22}$ and the NMOS transistor $MN_{22}$ becomes the ground potential level. The first threshold value $V_{th1}$ is equal to the threshold voltage $V_{thn}$ of the NMOS transistor $MN_{22}$. If the connection point $P2$ becomes the ground potential level, the output terminal of the inverter $INV_{21}$ becomes the power supply voltage level and the output terminal of the inverter $INV_{22}$ becomes the ground potential level.

Thus, the PMOS transistor $MP_{21}$ is turned on and the power supply voltage level is input to the inverting input terminal of the amplifier $A_1$ in the bandgap reference circuit 10. Moreover, the NMOS transistor $MN_{21}$ is turned on and the ground potential level is input to the non-inverting input terminal of the amplifier $A_1$ in the bandgap reference circuit 10.

In the amplifier $A_1$, if the power supply voltage level is input to the inverting input terminal and the ground potential level is input to the non-inverting input terminal, then the ground potential level is output from the output terminal. The ground potential level output from the output terminal of the amplifier $A_1$ is applied to the respective gate terminals of the PMOS transistors $MP_{11}$-$MP_{13}$, $MP_{22}$. This turns on each of the PMOS transistors $MP_{11}$-$MP^{13}$, $MP_{22}$.

If the PMOS transistor $MP_{11}$ is turned on, a current $I_{11}$ flows from the power supply voltage terminal through the source terminal and drain terminal of the PMOS transistor $MP_{11}$. The current $I_{11}$ is divided into two, and one current flows through the resistor $R_{11}$ and the resistor $R_{12}$ and the other current flows though the diode $D_{10}$.

If the PMOS transistor $MP_{12}$ is turned on, then a current $I_{12}$ flows from the power supply voltage terminal though the source terminal and drain terminal of the PMOS transistor $MP_{12}$. The current $I_{12}$ is divided into two, and one current flows through the resistor $R_{13}$ and the resistor $R_{14}$ and the other current flows through the resistor $R_{15}$ and N diodes $D_{11}$-$D_{1N}$.

If the PMOS transistor $MP_{13}$ is turned on, a current $I_{13}$ flows from the power supply voltage terminal through the source terminal and drain terminal of the PMOS transistor $MP_{13}$. The current $I_{13}$ further flows through the resistor $R_{16}$ and the resistor $R_{17}$.

Moreover, the PMOS transistor $MP_{22}$ of the first start-up circuit 20 is turned on. Since the on-resistance value of the NMOS transistor $MN_{22}$ is greater than the on-resistance value of the PMOS transistor $MP_{22}$, the connection point $P_2$ becomes the power supply voltage level. As a result, the respective PMOS transistor $MP_{21}$ and NMOS transistor $MN_{21}$ are turned off.

The action of the first start-up circuit 20 as described above allows the bandgap reference circuit 10 to start a stable operation. In the bandgap reference circuit 10 during the stable operation, a potential applied from the amplifier $A_1$ to the respective gate terminals of the PMOS transistors $MP_{11}$-$MP_{13}$ is set so that the connection point $P_{11}$ between the resistor $R_{11}$ and the resistor $R_{12}$ and the connection point $P_{12}$ between the resistor $R_{13}$ and the resistor $R_{14}$ become a potential equal to each other. Thus, even if the value of the power supply voltage VDD varies, a stable first voltage value $V_A$ may be output from the output terminal. Moreover, because the temperature dependences of the respective resistance values of the resistor and the diode cancel out with each other, the stable first voltage value $V_A$ may be output from the output terminal even if the temperature varies.

Accordingly, the first voltage value $V_A$ output from the bandgap reference circuit 10 takes uncertain values between the ground potential level and the power supply voltage level until the value of the power supply voltage VDD reaches the first threshold value $V_{th1}$. However, the first voltage value $V_A$ becomes a stable constant value if the value of the power supply voltage VDD reaches the first threshold value $V_{th1}$.

On the other hand, in the voltage dividing circuit 30 and the second start-up circuit 40, for a certain period immediately after starting to supply the power supply voltage, a connection point $P_{41}$ between the resistor $R_{41}$ and the resistor $R_{42}$ is close to the ground potential level and the PMOS transistor $MP_4$ is in an off state. Moreover, a connection point $P_{42}$ between the PMOS transistor $MP_4$ and the resistor $R_{43}$ is also close to the ground potential level and the PMOS transistor $MP_3$ is in an off state. Accordingly, the second voltage value $V_B$ output from a connection point $P_{31}$ between the resistor $R_{31}$ and the resistor $R_{32}$ is at the ground potential level.

If the value of the power supply voltage VDD reaches the second threshold value $V_{th2}$, then, in the second start-up circuit 40, the potential difference between the source terminal and gate terminal of the PMOS transistor $MP_4$ becomes the threshold voltage $V_{thp}$ or higher and the PMOS transistor $MP_4$ is turned on. The second threshold value $V_{th2}$ is expressed by a formula "$V_{th2=Vthp}(R_{41}+R_{42})R_{42}$". If the PMOS transistor $MP_4$ is turned on, the potential difference between the source terminal and gate terminal of the PMOS transistor $MP_3$ becomes the threshold value or higher and the PMOS transistor $MP_3$ is turned on.

Then, if the PMOS transistor $MP_3$ is turned on, the second voltage value $V_B$ output from the voltage dividing circuit 30 becomes a voltage value, which is derived by dividing the value of the power supply voltage VDD according to a ratio of the respective resistance values of the resistor $R_{31}$ and the resistor $R_{32}$, and gradually increases proportional to the power supply voltage VDD. Neglecting the on-resistance value of the PMOS transistor $MP_3$, the second voltage value $V_B$ is expressed by a formula "$V_B = VDD \cdot R_{32}/(R_{31}+R_{32})$".

As shown in FIG. 2, the first voltage value $V_A$ output from the bandgap reference circuit 10 becomes a stable constant value if the value of the power supply voltage VDD reaches the first threshold value $V_{th1}$. On the other hand, the second voltage value $V_B$ output from the voltage dividing circuit 30 is at the ground potential level until the value of the power supply voltage VDD reaches the second threshold value $V_{th2}$, and becomes a value proportional to the power supply voltage VDD when the value of the power supply voltage VDD is the second threshold value $V_{th2}$ or higher. Provided that the second threshold value $V_{th2}$ is greater than the first threshold value $V_{th1}$.

Accordingly, the magnitude relation between the first voltage value $V_A$ and the second voltage value $V_B$ is reversed at a certain time instance $t_1$ after starting to supply the power supply voltage VDD until the power supply voltage VDD becomes stable, as a boundary. That is, before the time instance $t_1$, because the second voltage value $V_B$ is smaller than the first voltage value $V_A$, the power-on reset signal POR output from the voltage comparison circuit 50 is at the ground potential level. After the time instance $t_1$, because the second voltage value $V_B$ is greater than the first voltage value $V_A$, the power-on reset signal POR output from the voltage comparison circuit 50 is at the power supply voltage level. In this manner, the power-on reset circuit 1 according to the embodiment can stably provide a sufficient length of reset period.

Note that it is important that the respective resistors, diodes, PMOS transistors, and NMOS transistors constituting each circuit are designed and manufactured so that the desired characteristics as described above may be obtained. Particularly with regard to the PMOS transistors and NMOS transistors, their characteristics vary if the manufacturing conditions vary. It is therefore important that these transistors have some design margin so that the desired characteristics may be obtained even if the manufacturing conditions vary.

Figure 3:
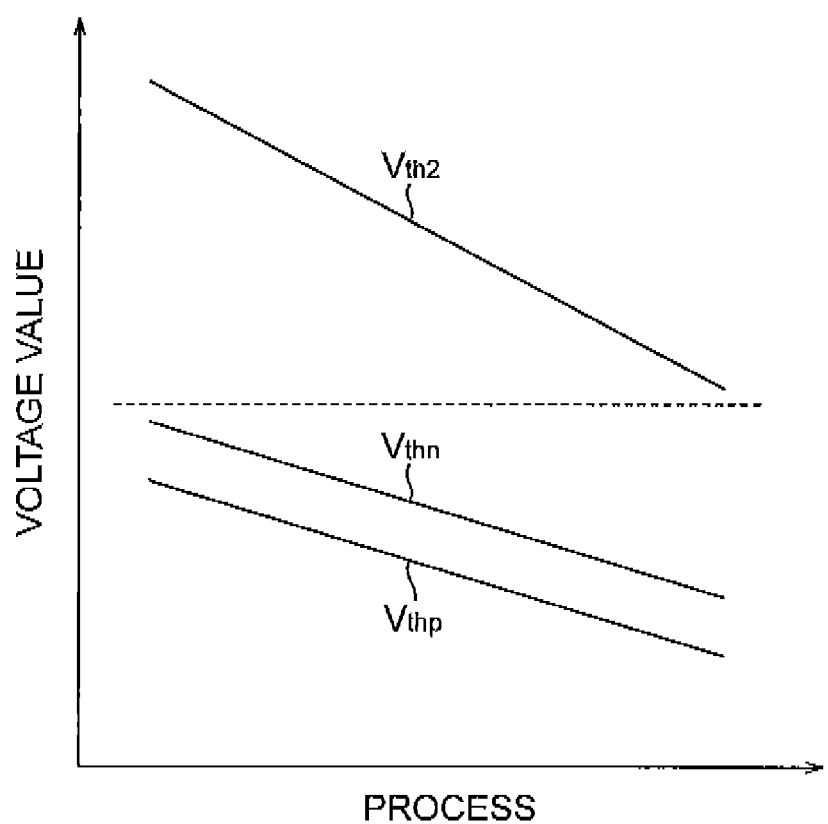
FIG. 3 is a graph schematically showing the process condition dependence of each of a threshold voltage $V_{thp}$ of a PMOS transistor $MP_{22}$, a threshold voltage $V_{thn}$ of an NMOS transistor $MN_{22}$, and a second threshold value $V_{th2}$ which the voltage dividing circuit 30 activates, in the power-on reset circuit 1 according to the embodiment.

FIG. 3 is a graph schematically showing the process condition dependence of each of the threshold voltage $V_{thp}$ of the PMOS transistor $MP_{22}$, the threshold voltage $V_{thn}$ of the NMOS transistor $MN_{22}$, and the second threshold value $V_{th2}$ which the voltage dividing circuit 30 activates, in the power-on reset circuit 1 according to the embodiment. In order for the voltage dividing circuit 30 to be activated after the bandgap reference circuit 10 is activated, it is important that the PMOS transistors and the NMOS transistors are designed so as to satisfy a condition "$V_{th2} > V_{thn}$" in a total range of the process condition variations, as shown in this graph, even if the manufacturing conditions vary.

The invention is not limited to the above-described embodiment, but various modifications are possible. For example, various configurations are possible for each circuit constituting the power-on reset circuit 1.

INDUSTRIAL APPLICABILITY

The invention can be applied to the power-on reset circuits for stably providing a sufficient length of reset period.

REFERENCE SIGNS LIST

1 power-on reset circuit
10 bandgap reference circuit
20 first start-up circuit
30 voltage dividing circuit
40 second start-up circuit
50 voltage comparison circuit

The invention claimed is:

1. A power-on reset circuit, comprising:
a bandgap reference circuit to which a power supply voltage is supplied, and which outputs a predetermined first voltage value;
a first start-up circuit, causing the bandgap reference circuit to start a stable operation when a value of the power supply voltage becomes a first threshold value or higher, wherein:
at least one input control terminal of the first start-up circuit is tied to the power supply voltage, and
a first output terminal of the first start-up circuit is tied to a first input terminal of the bandgap reference circuit and a second output terminal of the first start-up circuit is tied to a second input terminal of the bandgap reference circuit;
a voltage dividing circuit including: a switch and a first resistor provided in series between a power supply voltage terminal to which the power supply voltage is supplied and an output terminal of the voltage dividing circuit; and a second resistor provided between the output terminal of the voltage dividing circuit and a ground terminal, the voltage dividing circuit outputting a second voltage value from the output terminal of the voltage dividing circuit;
a second start-up circuit which causes the switch of the voltage dividing circuit to close when the value of the power supply voltage becomes a second threshold value or higher which is greater than the first threshold value; and
a voltage comparison circuit receiving the predetermined first voltage value output from the bandgap reference circuit and the second voltage value output from the voltage dividing circuit, and outputting a reset level voltage value when the second voltage value is smaller than the predetermined first voltage value and outputting a power-supply voltage level voltage value if the second voltage value becomes the predetermined first voltage value or higher.

2. The power-on reset circuit according to claim 1, wherein the first input terminal of the bandgap reference circuit and the second input terminal of the bandgrap reference circuit are, respectively, the positive terminal and the negative terminal of a differential circuit element.

3. A power-on reset circuit, comprising:
a bandgap reference circuit to which a power supply voltage is supplied, and which outputs a predetermined first voltage value;
a first start-up circuit which is directly connected to the power supply voltage and causes the bandgap reference circuit to start a stable operation when a value of the power supply voltage becomes a first threshold value or higher;
a voltage dividing circuit including: a switch, having an input control terminal, and a first resistor, which are provided in series between a power supply voltage terminal to which the power supply voltage is supplied and an output terminal of the voltage dividing circuit; and a second resistor provided between the output terminal of the voltage dividing circuit and a ground terminal, the voltage dividing circuit outputting a second voltage value from the output terminal of the voltage dividing circuit;

a second start-up circuit which is directly connected to the power supply voltage, and which has an output terminal connected to the input control terminal of the switch included in the voltage dividing circuit, and which outputs a voltage which causes the switch of the voltage dividing circuit to close when the value of the power supply voltage becomes a second threshold value or higher which is greater than the first threshold value; and a voltage comparison circuit receiving the predetermined first voltage value output from the bandgap reference circuit and the second voltage value output from the voltage dividing circuit, and outputting a reset level voltage value when the second voltage value is smaller than the predetermined first voltage value and outputting a power-supply voltage level voltage value if the second voltage value becomes the predetermined first voltage value or higher.

\* \* \* \* \*